(12) United States Patent
Jiang et al.

(10) Patent No.: US 12,063,016 B2
(45) Date of Patent: Aug. 13, 2024

(54) AMPLIFIERS WITH ATTENUATOR IN FEEDBACK AND BYPASS PATHS

(71) Applicant: pSemi Corporation, San Diego, CA (US)

(72) Inventors: Rong Jiang, San Diego, CA (US); Parvez Daruwalla, San Diego, CA (US); Khushali Shah, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 469 days.

(21) Appl. No.: 17/483,316

(22) Filed: Sep. 23, 2021

(65) Prior Publication Data

US 2023/0090460 A1    Mar. 23, 2023

(51) Int. Cl.
| | |
|---|---|
| *H03F 1/22* | (2006.01) |
| *H03F 1/02* | (2006.01) |
| *H03F 3/193* | (2006.01) |
| *H03F 3/21* | (2006.01) |

(52) U.S. Cl.
CPC .......... *H03F 3/193* (2013.01); *H03F 1/0205* (2013.01); *H03F 3/21* (2013.01); *H03F 2200/294* (2013.01); *H03F 2200/451* (2013.01); *H03F 2200/51* (2013.01)

(58) Field of Classification Search
CPC .......... H03F 3/193; H03F 1/0205; H03F 3/21; H03F 2200/294; H03F 2200/451; H03F 2200/51; H03F 2200/159; H03F 1/342; H03F 2203/7239; H03F 3/72; H03F 1/223; H03F 1/22; H03F 3/16; H03F 3/1935; H03F 2200/372; H03F 3/45475; H03G 1/0088; H03G 2201/106; H03G 1/007
USPC .......................................... 330/277, 282, 311
See application file for complete search history.

(56) References Cited

U.S. PATENT DOCUMENTS

| | | | |
|---|---|---|---|
| 6,476,660 B1 | 11/2002 | Michelle et al. | |
| 8,102,214 B2 * | 1/2012 | Park | H03F 1/342 330/311 |
| 8,217,723 B2 * | 7/2012 | Rajendran | H03F 3/191 330/311 |

(Continued)

FOREIGN PATENT DOCUMENTS

JP     2020195033 A     12/2020

OTHER PUBLICATIONS

International Search Report and Written Opinion for International Application No. PCT/US2022/076668 filed on Sep. 19, 2022 on behalf of pSemi Corporation. Mailed on Jan. 6, 2023. 13 pages.

*Primary Examiner* — Khanh V Nguyen
(74) *Attorney, Agent, or Firm* — Steinfl + Bruno LLP (57) ABSTRACT

Methods and devices to support multiple gain states in amplifiers are described. The methods and devices are based on implementing a feedback element in the amplifier and adjusting the impedance of the feedback element to provide a desired gain while maintaining the overall performance of the amplifier and reducing degradation of the S12 parameter. The feedback element includes an adjustable attenuator and a tunable resistive element. The adjustable attenuator is provided in a path that is common to the feedback path and the bypass path of the amplifier. Exemplary implementations of adjustable attenuators are also presented.

22 Claims, 7 Drawing Sheets

(56) References Cited

U.S. PATENT DOCUMENTS

| 11,616,475 B2* | 3/2023 | Jiang ............... H03F 3/193 |
| | | 330/149 |
| 2015/0035595 A1 | 2/2015 | Harwalkar et al. |
| 2019/0363680 A1 | 11/2019 | Yoo et al. |
| 2019/0386624 A1 | 12/2019 | Ye et al. |
| 2022/0393650 A1* | 12/2022 | Ayranci ............ H03F 1/223 |
| | | 330/311 |

* cited by examiner

AMPLIFIERS WITH ATTENUATOR IN FEEDBACK AND BYPASS PATHS

BACKGROUND

(1) Technical Field

The present disclosure is related to amplifiers, more in particular to amplifiers (e.g. power amplifiers or low noise amplifiers, LNAs) implementing an adjustable attenuator in the feedback and bypass paths to support multiple gain states.

(2) Background

In different radio frequency (RF) applications, LNAs are designed to support multi-gain modes, i.e., high gain, low gain, and passive bypass modes. More in particular, such LNAs are required to support several gain states when operating in the low gain and passive bypass modes. This needs to be done while meeting performance requirements such as linearity, noise figure (NF), return loss, reverse isolation, Input Third Order Intercept Point (IIP3), etc.

In some existing LNAs, a feedback path from the output to the input is implemented as a mechanism to further lower the overall gain of the amplifier, thus providing an additional avenue for supporting the low gain mode. In such LNAs, an adjustable resistance is disposed in the feedback path to provide an adjustable feedback from the LNA output to the input, thus allowing for the presence of different gain states when operating in the low gain mode. However, in this approach, and when operating in the low gain mode, the LNA input-output isolation may degrade and as a result, the S12 parameter (power transferred from the output port to the input port, also known as reverse transmission) will suffer and may not meet the corresponding stringent requirement.

In view of the above, providing multiple gain levels while maintaining the overall performance requirements (e.g., meeting the S12 requirement) imposes design challenges when implementing LNAs (or, more generally, amplifiers such as power amplifiers) for different RF applications.

This disclosure is also to enable additional bypass gain levels without degrading high gain performance. If the additional attenuator, which is used to achieve additional bypass gain levels, is added to the output, it is also in the high gain path. Though the attenuator at the output is shorted, it will hurt the S21 in high gain mode. However, if it is placed in the shared feedback path, it will not interfere with high gain performance.

SUMMARY

The disclosed methods and devices address the above-mentioned issue. and provide solutions to the described LNA design challenges.

According to a first aspect of the present disclosure, an amplifier is provided, comprising: one or more transistors; and a feedback element selectively coupling a drain terminal of a last transistor of the one or more transistors to a gate terminal of a first transistor of the one or more transistors, the feedback element comprising a series connection of a first attenuator, and a resistive element, the first attenuator or the resistive element having an adjustable value; wherein: in a first controllable state, a first path is formed through, the first attenuator and the resistive element of the feedback element, and in a second controllable state, a second path different from the first path is formed through the first attenuator of the feedback element, the second path bypassing the resistive element.

According to a second aspect of the present disclosure, a method of adjusting a gain of an amplifier is disclosed, comprising: providing one or more transistors; coupling a drain terminal of a last transistor of the one or more transistors to a gate terminal of a first transistor of the one or more transistors through a feedback element, the feedback element comprising a series connection of an attenuator, and a tunable resistive element, the attenuator or the resistive element having an adjustable value, the adjustable attenuator comprising at least one shunt impedance element; and adjusting an output impedance and an input impedance of the feedback element by adjusting the adjustable attenuator and the resistive element, wherein the gain of the amplifier is adjusted without impacting a reverse transmission parameter (S12) of the amplifier.

The details of one or more embodiments of the present disclosure are set forth in the accompanying drawings and the description below. Other features, objects, and advantages of the invention will be apparent from the description and drawings, and from the claims.

According to the teachings of the present disclosure, additional bypass gain levels are enabled without degrading high gain performance thanks to presence of an additional attenuator located in a shared feedback path.

DESCRIPTION OF THE DRAWINGS

Like reference numbers and designations in the various drawings indicate like elements.

DETAILED DESCRIPTION

Figure 1A:
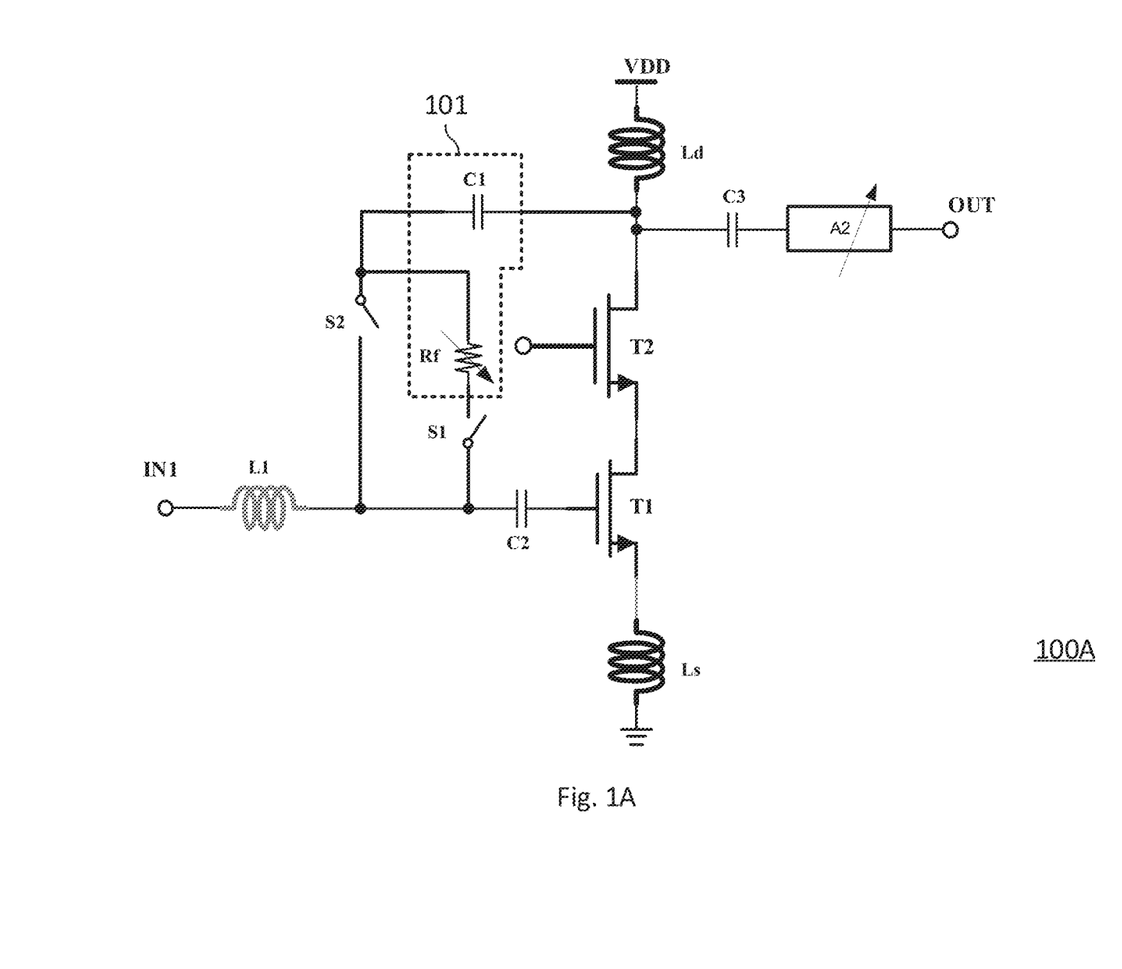
FIG. 1A shows a single input LNA.

FIG. 1A shows an LNA (100A) comprising cascode transistors (T1, T2), input terminal (IN1), output terminal (OUT), switches (S1, S2), feedback element (101) including tunable resistor (Rf), and capacitor (C2). LNA (100A) further comprises capacitor (C1), inductor (L1) coupling input terminal (IN1) to the gate terminal of transistor (T1), inductor (Ls) coupling the source terminal of transistor (T1) to ground, and inductor (Ld) coupling power supply (VDD) to the drain terminal of transistor (T2). A gate bias network (not shown) may also be included. Such gate bias network may be connected such that a common gate configuration is supported. This topology may work with LNA with only device T1, or cascode topology with both T1 and T2 as shown in FIG. 1A, or three stacked devices with T1, T2 and T3.

LNA (100A) of FIG. 1A can operate in high and low gain modes, as well as in a bypass mode. In the high gain mode, switches (S1, S2) are in OFF state (open) and the radio frequency (RF) signal coming in at input terminal (IN1) is amplified through cascode transistors (T1, T2) and then routed to output terminal (OUT). In the low gain mode, switch (S1) is in ON state (closed), and switch (S2) is in OFF state (open). In such mode, feedback element (101) couples the drain terminal of transistor (T2) to gate terminal of transistor (T1) through switch (S1). As a consequence, a feedback path through switch (S1), tunable resistor (Rf) and capacitor (C1) is defined. The input signal is amplified through cascode transistors (T1, T2). However, while operating in such low gain mode, the signal experiences a lower gain due to the feedback mechanism provided by the combination of capacitor (C1) and tunable resistor (Rf). Additionally, when operating in the bypass mode, switch (S1) is in OFF state (open), and switch (S2) is in ON state (closed). As a consequence, a bypass path through switch (S2) and capacitor (C1) is defined. As such, transistors (T1, T2) are bypassed, and the input signal is conveyed directly to output terminal (OUT), through capacitors (C1, C3), and without being amplified.

Continuing with the description of FIG. 1A, when operating in the low gain mode, LNA (100A) can support several gain states by adjusting tunable resistor (Rf) to different values. As an example, reducing the resistance of tunable resistor (Rf) will result in an increased feedback of the output signal to the input, thereby reducing the overall gain of LNA (100A). Such increased feedback is also known to improve the linearity performance. However, increasing the feedback may lower the input-output isolation and as a result, the S12 parameter may not meet the corresponding requirement anymore. In other words, when designing for multiple gain states in the low gain mode, care should be taken to ensure that the overall performance parameters, more in particular the S12 parameter, still meet the corresponding requirements.

Figure 1B:
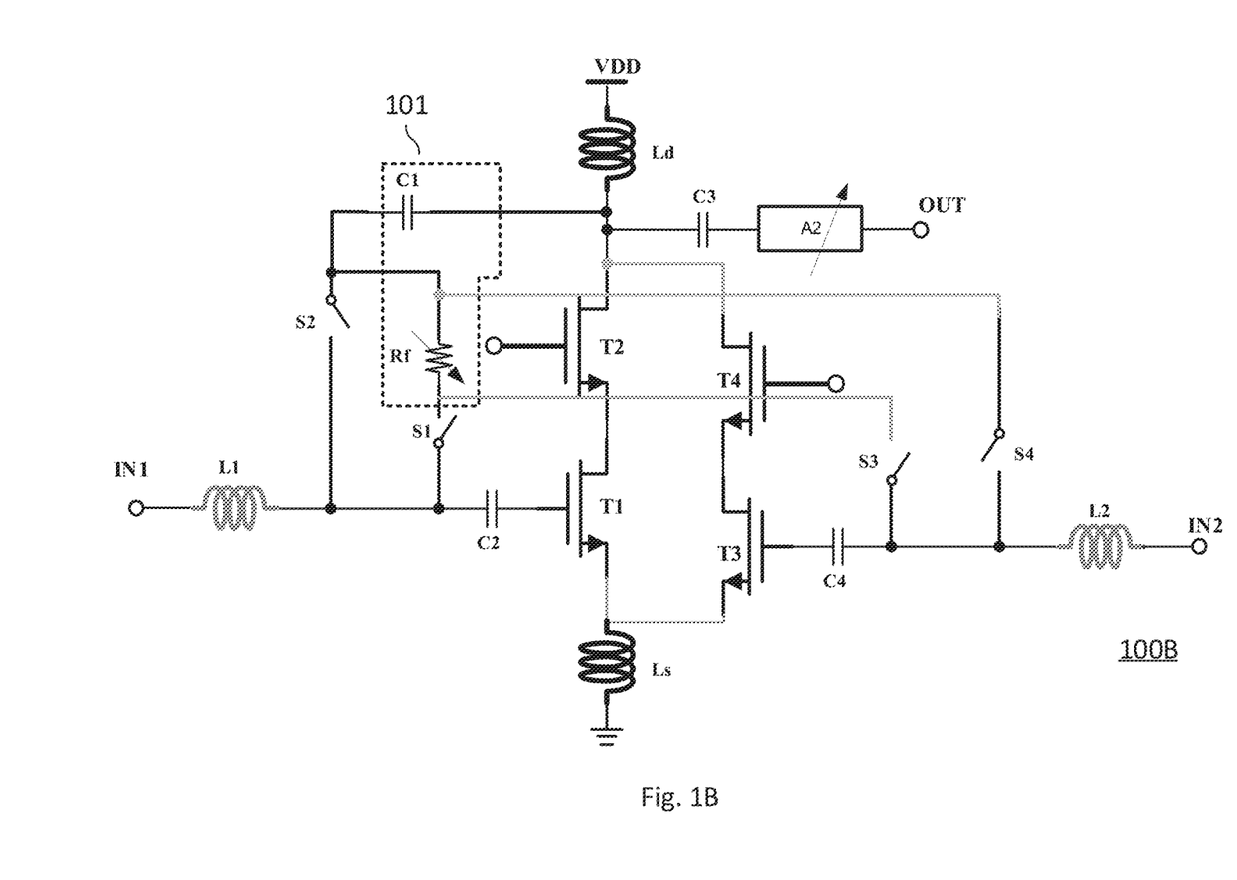
FIG. 1B shows a multiple-input LNA.

As can be noticed, LNA (100A) of FIG. 1A is a single-input (IN1) LNA. However, what was described above equally applies to multi-input LNAs. In order to further clarify this point, reference is made to FIG. 1B showing LNA (100B) representing an LNA with multiple inputs, e.g. two inputs (IN1, IN2). Compared to LNA (100A) of FIG. 1A, LNA (100B) further includes an additional input terminal (IN2), together with cascode transistors (T3, T4) and switches (S3, S4) which are dedicated to the signal coming from input terminal (IN2). The principle of operation of LNA (100B) is similar to what was described with regards to LNA (100A) of FIG. 1A and the LNA functionalities in various gain modes as described above are supported for the signals coming in from either one of the input terminals (IN1, IN2).

With continued reference to FIG. 1B, as can be noticed, the feedback element (101) containing capacitor (C1) and tunable resistor (Rf) is shared between the two inputs. Transistors (T3, T4) and switches (S3, S4) essentially mirror the functionalities of their respective counterparts, transistors (T1, T2) and switches (S1, S2), but for the signal coming from input terminal (IN2). Similarly to what was described with regards to LNA (100A) of FIG. 1A, there exist challenges when designing LNA (100B) to support multiple gain states while maintaining the overall LNA performance, e.g., meeting the S12 parameter requirement.

Figure 2A:
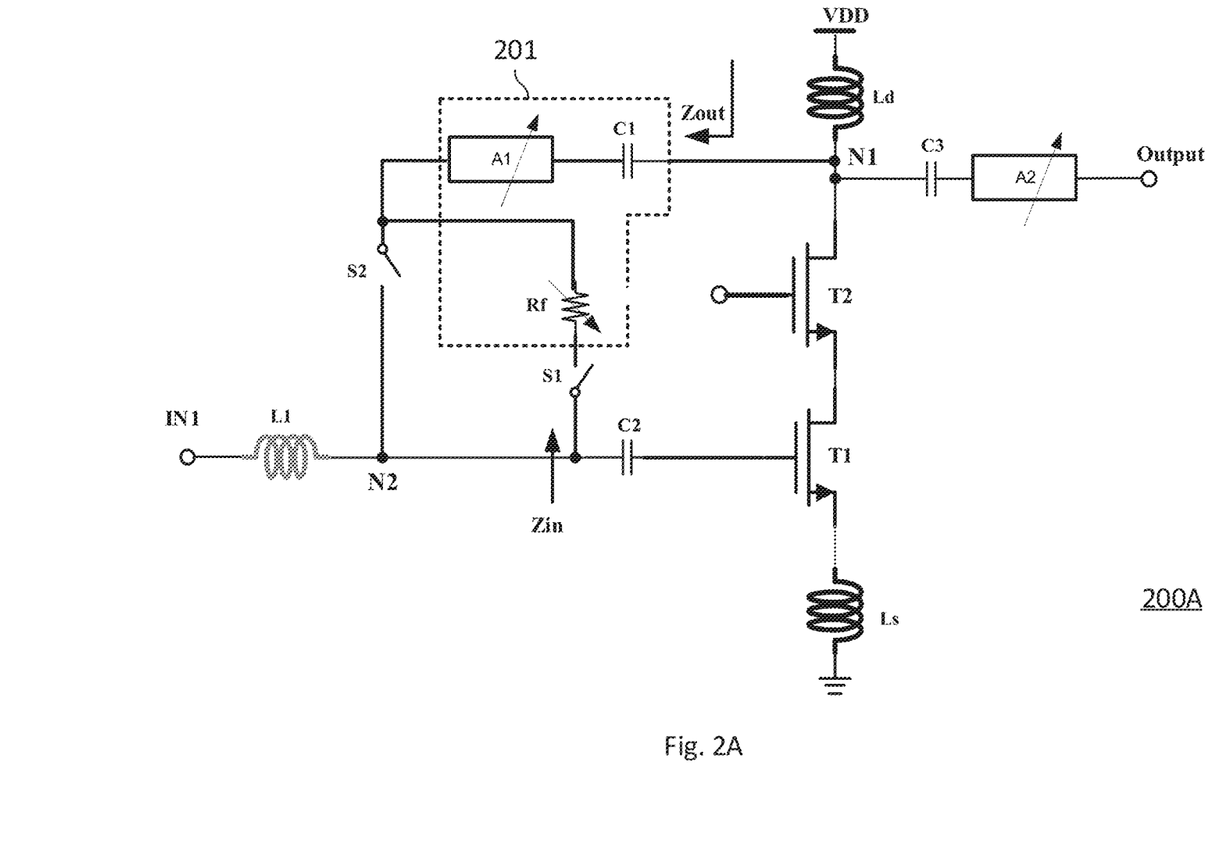
FIG. 2A shows an exemplary single input LNA according to an embodiment of the present disclosure.

FIG. 2A shows an exemplary single-input LNA (200A) according to an embodiment of the present disclosure. With respect to LNA (100A) of FIG. 1A, LNA (200A) of FIG. 2A further comprises an adjustable attenuator (A1) as part of the feedback element (201), and adjustable attenuator (A2) ac-coupled to the drain of transistor (T2). In the embodiment of FIG. 2A, adjustable attenuator (A1) is in series with capacitor (C1) and, similarly to capacitor (C1), is located in a path that is common to the feedback path and the bypass path of the LNA (200A). According to the teachings of the present disclosure, the addition of adjustable attenuator (A1) provides the benefit of supporting multiple gain states (e.g., 12 gain states or more) while maintaining the S12 parameter within specification values (e.g., −25 dBm or lower). This is further clarified through some exemplary implementations of adjustable attenuators (A1, A2) as described below.

Figure 2B:
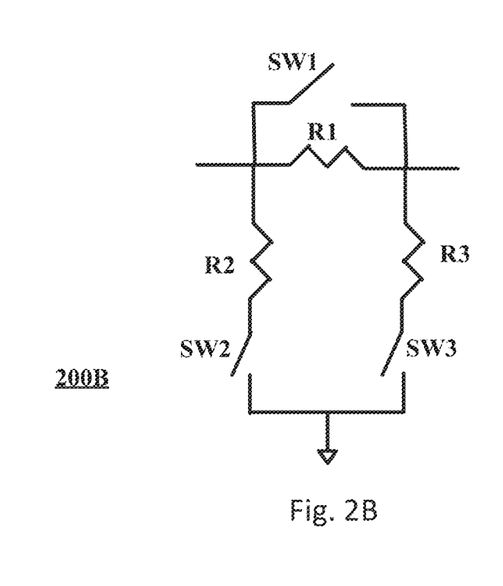
FIGS. 2B-2C show exemplary implementations of an adjustable attenuator.
Figure 2C:
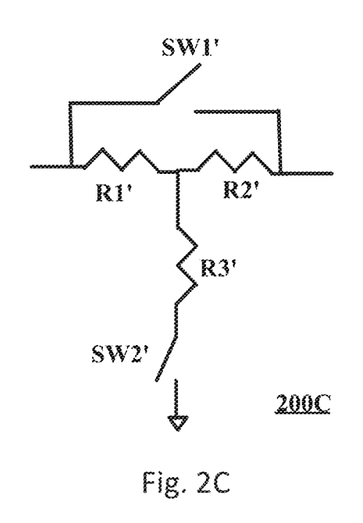

FIGS. 2B-2C show exemplary implementations of either of adjustable attenuators (A1, A2) of FIG. 2A. Adjustable attenuator (200B) comprises resistors (R1, . . . , R3) arranged in a Pi-network configuration (i.e., shunt-series-shunt configuration). Each of the resistors (R1, . . . R3) may be selectively switched in and out, using respective switches (SW1, . . . , SW3) to provide adjustability. FIG. 2C shows another exemplary implementation (200C) with resistors (R1', . . . , R3') and switches (SW1', SW2') where the resistors are arranged in a T-network configuration. Series combinations of these circuits (FIGS. 2B and 2C) can be used to achieve programmable attenuation.

Turning back to FIG. 2A, the inventors conducted several simulations with the LNA operating in the low gain mode, and by implementing, for example, adjustable attenuator (200B) of FIG. 2B to represent adjustable attenuator (A1) of FIG. 2A. In such simulations, input and output impedances (Zin, Zout) of the feedback loop of FIG. 2A were analyzed and compared in the two cases where adjustable attenuator (200B) was switched in and out. The results showed that output impedance (Zout) decreased noticeably (with respect to a scenario when the attenuator is switched out) when attenuator (200B) is switched in while the input impedance (Zin) remained the same. In other words, and as a result, the additional presence of adjustable attenuator (A1) in a path that is common to the feedback path and the bypass path of the LNA allows for further gain reduction (i.e., an additional gain state is provided). Stated differently, feedback element (201) of FIG. 2A has a first controllable state (switch (S2) ON, switch (S1) OFF) including adjustable attenuator (A1) and capacitor (C1) but not including tunable resistor (Rf), and a second controllable state (switch (S2) OFF, switch (S1) ON) also including tunable resistor (Rf). The first controllable state allows different settings in the bypass mode of the LNA, while the second controllable state allows for different settings in the low gain mode of the LNA. Additionally, isolation is improved primarily because the shunt resistor (R2) of the attenuator (200B) shown in FIG. 2B reduces the feedback strength (R1 reduce the feedback strength slightly as well but has much less contribution comparing R2), while shunt resistor (R3) of the attenuator (200B) shown in FIG. 2B reduces the output swing. This means that a lower gain is achieved without impacting the S12 parameter.

Continuing with the simulations described above and with continued reference to FIGS. 2A-2B, voltage levels ($V_{N1}$, $V_{N2}$) of respective nodes (N1, N2) were also analyzed. The results show that the ratio of such voltage levels, i.e. $V_{N2}/V_{N1}$, decreased when adjustable attenuator (201) is switched in. This again demonstrates an improved isolation between the output and input, thus an improved S12 parameter.

The teachings of the present disclosure where an adjustable attenuator is shown in series with a feedback resistor in an amplifier such as a power amplifier or an LNA in a common feedback path, provide an improvement over cases where such adjustable attenuator is not present. In particular, according to the present disclosure, the provided attenuation can be shared between the variable resistor (Rf) and the attenuator (A1), thus providing a beneficial trade-off between more attenuation and less feedback, and vice versa. By way of example, the amount of attenuation can be expressed in terms of an attenuation factor going from 0 to 1, where a desired factor (e.g. 0.25) is assigned to the feedback resistor (Rf) and the remaining amount (e.g. 0.75) is assigned to the variable attenuator (A1). In view of such terminology, a case where no attenuator is present would be indicated as an attenuation factor of 1.0 applied to the feedback resistor (Rf).

Figure 3A:
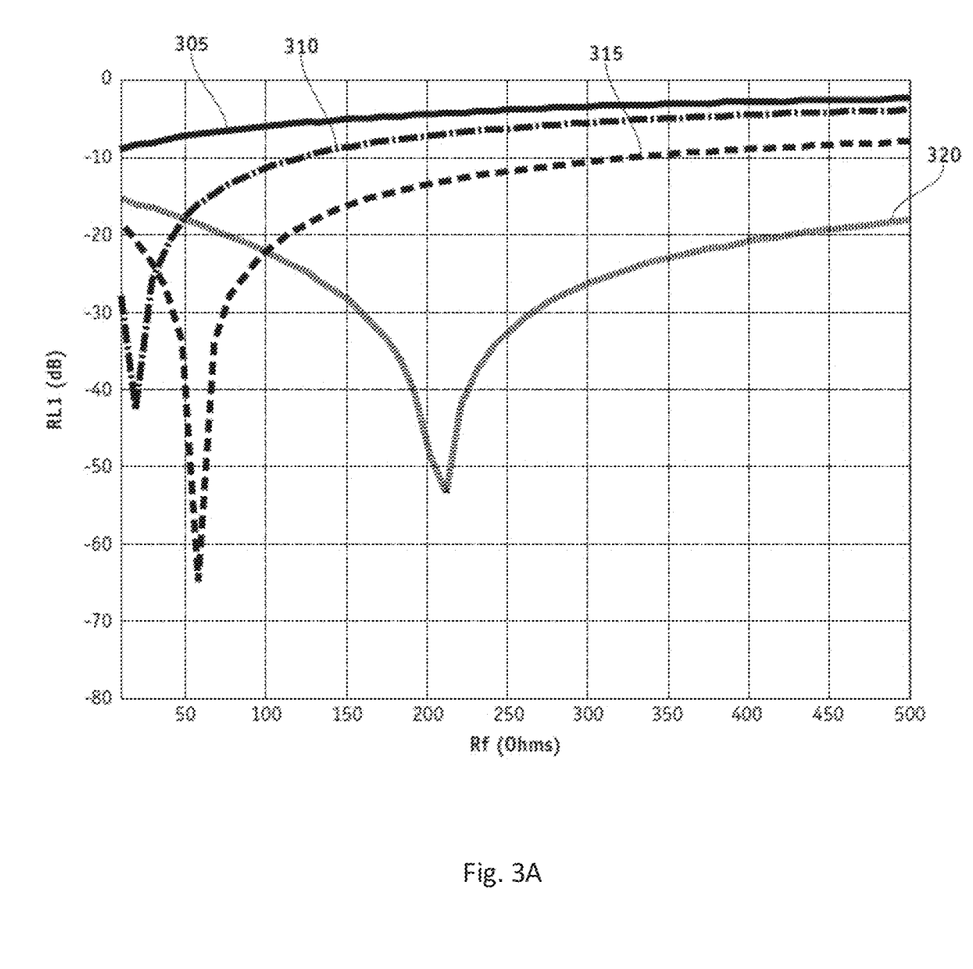
FIGS. 3A-3B show respective input and output return loss curves with different degrees of attenuation factors shared between the feedback resistor and the variable attenuator of FIG. 2A.
Figure 3B:
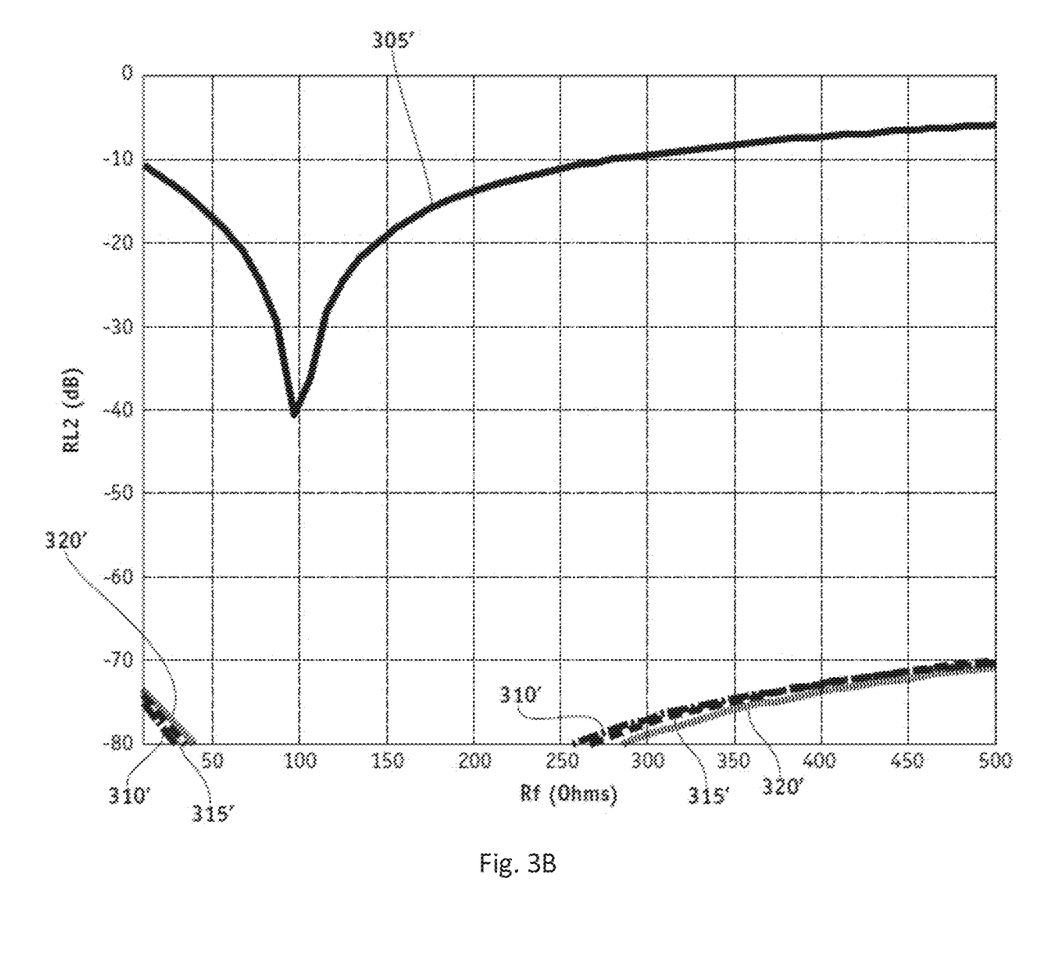

FIGS. 3A and 3B show results of a simulation in case of a T-architecture attenuator like the one shown in FIG. 2C for variable resistance values of the feedback resistor Rf from 50 to 500 ohms. Four different cases in both figures are presented: 1) no attenuator (i.e. attenuation factor of the attenuator equals to 0, top curve (305, 305')); 2) attenuator with an attenuator factor of 0.5 (curve (310, 310') under the first curve), 3) attenuator with an attenuator factor of 0.75 (curve (315, 315') under the second curve) and 4) attenuator with an attenuator factor of 0.9 (curve (320, 320') under the third curve). FIG. 3A shows the behavior of the input return loss (RL1) as a function of (Rf) and the input and output impedances (Zin, Zout) shown in FIG. 2A. On the other hand, FIG. 3B shows the behavior of the output return loss (RL2) as a function of Rf and the input and output impedances (Zin, Zout) shown in FIG. 2A. In both such exemplary cases, the architecture of the attenuator is the T-architecture shown in FIG. 2C.

As seen in such figures, the higher the amount of attenuation, the better (i.e. lower) the value of input and output return loss. Such diagrams also show that independently of trying to obtain lower values of input or output return loss, the presence of the variable attenuator (A1) allows the circuit designer to balance such values with other consideration that may be typical of the specific implementation chosen. As a consequence, the presence of such attenuator provides additional degrees of freedom that enable a more stable return loss across a wide attenuation and feedback range. In particular, once a certain given gain level is desired, the circuit designer can partition the attenuation contribution in a way that also minimizes RL1 and RL2, with a more stable result and without an unneeded sacrifice in the amount of feedback desired.

Turning back now to FIG. 2A, such figure also shows adjustable attenuator (A2) coupled to the drain of transistor (T2), in series with output capacitor (C3). Adjustable attenuator (A2) may be used to provide different gain states when the LNA operates in a high gain mode or low gain mode as well. (Note: Though A2 is not interacting with feedback path (which means feedback strength from T1 gate to T2 drain is not changed), it does improve S12 as well, as it is directly on the path from output to input.) Similarly to adjustable attenuator (A1), adjustable attenuator (A2) may be implemented using any of the configurations shown in FIGS. 2B-2C.

With continued reference to FIG. 2A, as already noted above, adjustable attenuator (A1) is also in the signal path when LNA (200A) is operating in bypass mode. In other words, different states in the bypass path can be supported also when the LNA is in the bypass mode. Turning now to adjustable attenuator (A2), will help achieve additional bypass gain levels. However, in the high gain mode, the additional parasitic components introduced by (A2) will affect the S21 parameter since (A2) is located on the main path. As a consequence, an embodiment where (A2) is implemented in series with (A1) may be preferred in cases where there are stringent requirements against the degradation of the S21 gain parameter.

Figure 2D:
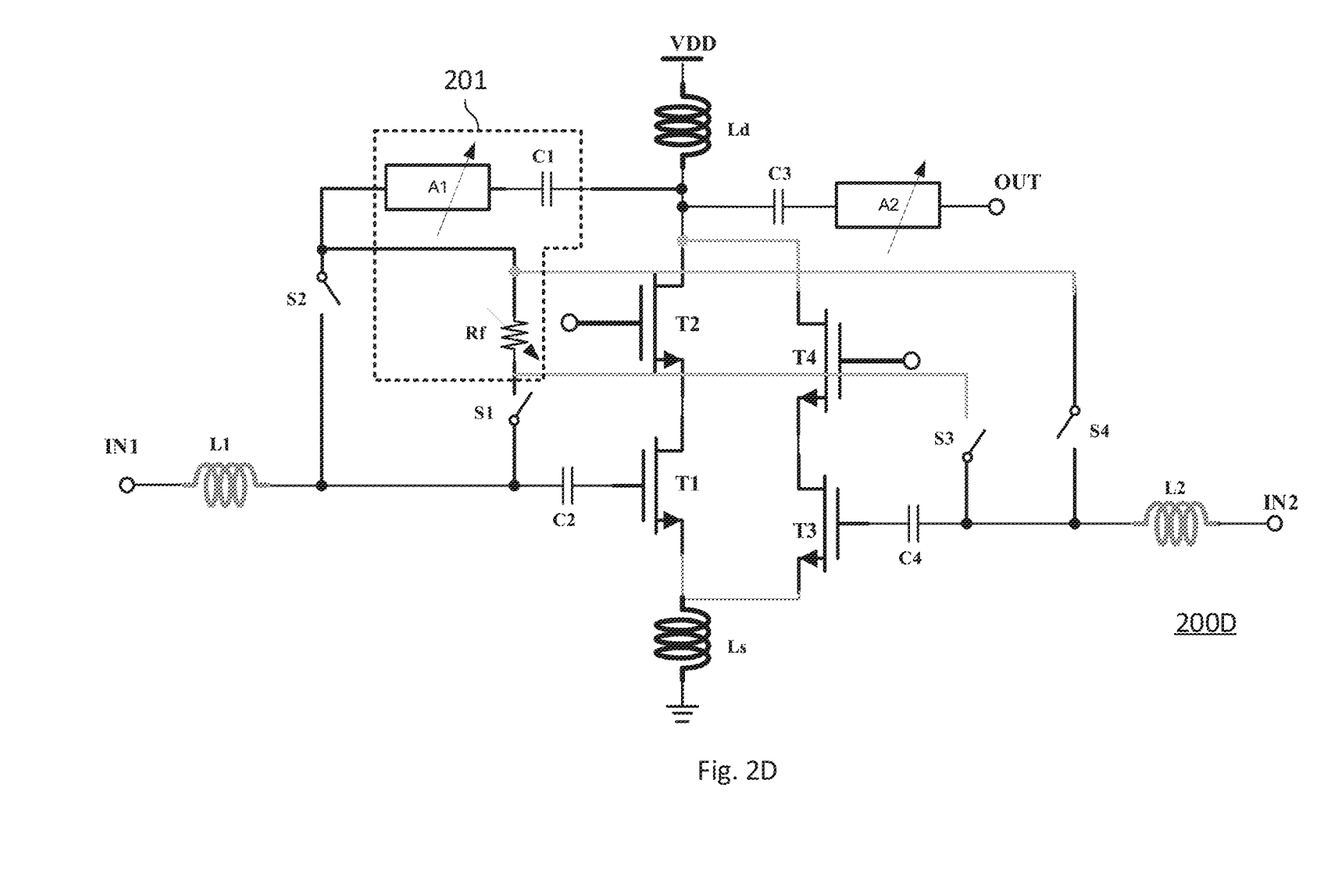
FIG. 2D shows an exemplary multi-input LNA according to an embodiment of the present disclosure.

FIG. 2D shows an exemplary multi-input (e.g. 2-input) LNA (200D) according to an embodiment of the present disclosure. Compared to LNA (200A) of FIG. 2A, LNA (200D) further includes an additional input terminal (IN2), cascode transistors (T3, T4), switches (S3, S4) which are dedicated to the signal coming from input terminal (IN2). The principle of operation of LNA (200D) is similar to what was described with regards to LNA (200A) of FIG. 2A and the LNA functionalities in various gain modes as described above are supported for the signals coming from either of the input terminals (IN1, IN2). More in particular, LNA (200D) benefits from implementing adjustable attenuators (A1, A2) in a similar way to what was described with regards to LNA (200A) of FIG. 2A.

With reference to FIGS. 2A-2D, switches (S1, . . . , S4) and (SW1, . . . , SW3) may be controlled using a control circuit. The disclosed LNAs may be used as part of a communication module or system, RF front-ends and/or integrated circuits.

While the embodiment of FIG. 2A has been shown with two transistors T1, T2 in a cascode configuration, the person skilled in the art will understand that the teachings of the present disclosure also apply to configurations where only one transistor or more than two transistors (e.g. three stacked devices or more) are present. Similar considerations can be made with reference to the embodiment of FIG. 2D with reference not only to transistors T1, T2 but also to transistors T3, T4.

Additionally, while the embodiment of FIG. 2A has been shown with one input IN1 and the embodiment of FIG. 2D has been shown with two inputs IN1, IN2, the teachings of the present disclosure apply also to a higher number of inputs and related structural elements, e.g. three inputs IN1, IN2, IN3, each implying the presence of respective one or more transistors.

Furthermore, as also previously noted throughout the present text, the teachings of the present disclosure can be also applied to other circuits, not necessarily LNAs (e.g. amplifiers, such as power amplifiers), having an attenuator located in a common path shared in two different states (e.g. bypass and feedback states) of such circuits.

It should be also noted that while elements with a resistive component of the circuits shown in FIGS. 2A-2D have been shown as resistors (see, e.g. Rf), such elements can be also more generally be identified as impedances, e.g. complex impedances comprised of real and imaginary parts. In such cases, elements Rf, R1, R2 and R3 can be more generally be identified as Zf, Z1, Z2 and Z3, respectively.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An amplifier comprising:
   a plurality of transistors; and
   a feedback element selectively coupling a drain terminal of a last transistor of the plurality of transistors to a gate terminal of a first transistor of the plurality of transistors, the feedback element comprising a series connection of a first attenuator and a resistive element, the first attenuator or the resistive element having an adjustable value;
   wherein:
   in a first controllable state, a first path is formed through, the first attenuator and the resistive element of the feedback element, and
   in a second controllable state, a second path different from the first path is formed through the first attenuator of the feedback element, the second path bypassing the resistive element.

2. The amplifier of claim 1, configured to:
   operate in one of a first i) high gain mode, ii) low gain mode, and iii) bypass mode, and
   receive a first input signal at a first input terminal, the first input terminal being coupled to the gate terminal of the first transistor,
   wherein, in the first high gain mode, the first input signal is routed through the plurality of transistors to generate a first amplified output signal at an output terminal of the amplifier, the output terminal being coupled to the drain terminal of the last transistor.

3. The amplifier of claim 2, wherein in the first low gain mode:
   the first input signal is routed through the plurality of transistors to generate a second amplified output signal at the output terminal, and
   the second amplified output signal is partially fed back to the gate terminal of the first transistor through the feedback path.

4. The amplifier of claim 2, wherein in the first bypass mode:
   the plurality of transistors are bypassed, and
   the first input signal is routed from the first input terminal to the output terminal through the bypass path.

5. The amplifier of claim 3, wherein in the first low gain mode, a combination of the first attenuator and the resistor of the feedback element is configured to provide one or more gain states.

6. The amplifier of claim 4, wherein in the first bypass mode, the first attenuator is configured to provide one or more gain states.

7. The amplifier of claim 1, wherein the first attenuator comprises three impedance elements arranged in a Pi-network or T-network configuration, each impedance element being controllably switchable to provide one or more gain states of the amplifier in a low gain mode of the amplifier and in a bypass mode of the LNA.

8. The amplifier of claim 1, wherein the feedback element further comprises a first switch connected in series with the resistive element, the amplifier further comprising a second switch configured to couple the first attenuator to an input terminal of the amplifier and to the gate terminal of the first transistor.

9. The amplifier of claim 1, further comprising a second adjustable attenuator between the drain terminal of the last transistor and an output terminal of the amplifier.

10. The amplifier of claim 9, wherein the second adjustable attenuator is in series with an output capacitor.

11. The amplifier of claim 2, further comprising
a second input terminal;
a plurality of additional transistors arranged in a cascode configuration,
wherein
a gate terminal of a first additional transistor of the plurality of additional transistors is connected to the second input terminal,
a drain terminal of a last additional transistor of the plurality of additional transistors is connected to the drain terminal of the second transistor, and
the feedback element is configured to be selectively coupled to the gate terminal of the first additional transistor.

12. The amplifier of claim 11 configured to:
operate in one of a second i) high gain mode, ii) low gain mode, and iii) bypass mode; and
receive a second input signal at the second input terminal,
wherein in the second high gain mode, the second input signal is routed through the plurality of additional transistors to generate a third amplified output signal at the output terminal of the amplifier.

13. The amplifier of claim 12, wherein in the second low gain mode:
the second input signal is routed through the plurality of additional transistors to generate a fourth amplified output signal at the output terminal, and
the fourth amplified output signal is partially fed back to the gate terminal of the first additional transistor through the feedback path.

14. The amplifier of claim 12, wherein in the second bypass mode:
the plurality of additional transistors are bypassed, and
the second input signal is routed from the second input terminal to the output terminal through the bypass path.

15. The amplifier of claim 13, wherein in the second low gain mode, a combination of the first attenuator, and the resistive element of the feedback element is configured to provide one or more second gain states.

16. The amplifier of claim 1, wherein the plurality of transistors are arranged in a cascode configuration.

17. The amplifier of claim 1, wherein attenuation of the amplifier is shared between the first attenuator and the resistive element, wherein higher attenuation through the first attenuator implies lower attenuation through the resistive element and vice versa.

18. The amplifier of claim 1, wherein the feedback element further comprises a feedback capacitor disposed in series with the first attenuator and the resistive element.

19. A radio frequency (RF) receiver front-end comprising the amplifier of claim 1.

20. An integrated circuit comprising the amplifier of claim 1.

21. A power amplifier comprising the amplifier of claim 1.

22. A low noise amplifier (LNA) comprising the amplifier of claim 1.

* * * * *